US006097195A

United States Patent [19]

Ackland et al.

[11] Patent Number: 6,097,195

[45] Date of Patent: Aug. 1, 2000

[54] METHODS AND APPARATUS FOR INCREASING METAL DENSITY IN AN INTEGRATED CIRCUIT WHILE ALSO REDUCING PARASITIC CAPACITANCE

[75] Inventors: Bryan D. Ackland, Old Bridge; David A. Inglis, Holmdel; Gregory P. Kochanski, Dunellen, all of N.J.

[73] Assignee: Lucent Technologies Inc., Murray Hill, N.J.

[21] Appl. No.: 09/088,852

[22] Filed: Jun. 2, 1998

[51] Int. Cl.[7] .......... G01R 31/26

[52] U.S. Cl. .......... 324/719; 257/659

[58] Field of Search .......... 257/659, 508; 324/719, 722, 71.5, 627, 632, 671, 660

[56] References Cited

U.S. PATENT DOCUMENTS

| | | | |
|---|---|---|---|
| 4,628,144 | 12/1986 | Burger | 136/256 |
| 5,239,270 | 8/1993 | Desbiens | 324/719 |
| 5,325,442 | 6/1994 | Knapp . | |
| 5,539,292 | 7/1996 | Vranish | 318/568 |
| 5,594,279 | 1/1997 | Itou et al. | 257/758 |
| 5,608,242 | 3/1997 | Kamasz et al. | 257/216 |

*Primary Examiner*—Josie Ballato
*Assistant Examiner*—Vincent Q. Nguyen
*Attorney, Agent, or Firm*—Ryan & Mason, L.L.P.

[57] ABSTRACT

A shield region of metallization is formed in a first metallization layer of an integrated circuit so as to increase the metal density of the first metallization layer to at least a minimum density required for proper fabrication. The shield region is coupled via an amplifier or other suitable coupling mechanism to at least a portion of another metallization layer overlying or underlying the first metallization layer in the integrated circuit, such that the shield region acts to reduce parasitic capacitance associated with a circuit node in the other metallization layer. In an illustrative fingerprint sensor cell implementation, the shield region is in the form of a shield plate underlying a sensor plate in the sensor cell and serves to increase the metal density of a lower-level metallization layer in the cell. The sensor plate is coupled to the shield plate via a unity-gain amplifier, so as to reduce the parasitic capacitance seen by the sensor plate, thereby improving the ability of the sensor cell to detect fingerprint characteristics. The invention can provide similar advantages in numerous other integrated circuit applications.

24 Claims, 4 Drawing Sheets

12
+
-
OP AMP
OUT
IN
26
28
30
24
$C_{INT}$
METAL 1
METAL 2
METAL 3

METHODS AND APPARATUS FOR INCREASING METAL DENSITY IN AN INTEGRATED CIRCUIT WHILE ALSO REDUCING PARASITIC CAPACITANCE

FIELD OF THE INVENTION

The present invention relates generally to integrated circuits, and more particularly to integrated circuits which include multiple layers of metallization.

BACKGROUND OF THE INVENTION

Integrated circuits are typically fabricated using multiple layers of metallization to form the conductors used to connect various circuit elements. A given metallization layer is typically deposited over a processed semiconductor substrate and then etched to provide the desired pattern of conductors for that layer. The conductors of the given layer may be connected to other conductors of higher metallization layers as well as to semiconductor circuit elements previously formed in the substrate so as to provide the appropriate circuit functionality.

In general, it is desirable for any given metallization layer to have a metal density falling within specified minimum and maximum values in order for that layer to be formed properly during fabrication. The term "metal density" as used herein refers to the percentage of a given layer of metallization that includes metal after that layer is etched. The metal density may be measured, for example, in terms of the total area occupied by metal in an etched metallization layer, as a percentage of the total surface area of the corresponding integrated circuit. The minimum and maximum density values will typically vary depending upon factors such as the etching process and fabrication equipment used. If the metal density of the given metallization layer is either too low or too high, it is often difficult for fabrication equipment to etch the deposited metal layers reliably. For example, a metal density which is too high can result in the metal layer being over-etched, thereby removing required circuit connections. This type of excessive metal density problem can generally be resolved by, for example, appropriate distribution of conductors across multiple metallization layers or other suitable adjustment of the metallization layout. On the other hand, a metal density which is too low can overload an etching machine, which not only can result in unexpected connections, but can also result in metal thinning or voids in areas where connections are required.

Problems arising from insufficient metal density are typically rectified by forming metal "patches" in the low density metallization layer in order to provide an overall metal density which falls at or above a desired minimum value. The metal patches are arranged in various areas of the integrated circuit, and are generally connected to either ground or the substrate. However, this approach is inadequate in that adding metal patches connected to ground or the substrate tends to increase the parasitic capacitance associated with circuit nodes formed in the overlying or underlying metallization layers. A need therefore exists for a technique which can increase the metal density of a given metallization layer of an integrated circuit, without increasing the parasitic capacitance of circuit nodes in overlying or underlying metallization layers.

SUMMARY OF THE INVENTION

The present invention solves the problems associated with the above-described conventional techniques for increasing metal density, by coupling a metal shield region formed in an otherwise low-density metallization layer to a circuit node formed in an overlying or underlying metallization layer. The metal shield region serves to increase the metal density of the otherwise low-density metallization layer, and coupling the shield region to the other metallization layer serves to reduce the parasitic capacitance associated with one or more circuit nodes in that layer. As a result, the invention permits the inclusion of metal patches or other shield regions in a given metallization layer so as to increase its metal density, while at the same time actually decreasing the parasitic capacitance of circuit nodes in an overlying or underlying metallization layer.

In accordance with the invention, a shield region of metallization is formed in a first metallization layer of an integrated circuit so as to increase the metal density of that layer to at least a minimum density required for proper fabrication. The shield region is coupled via an amplifier or other suitable coupling mechanism to at least a portion of another metallization layer overlying or underlying the first metallization layer in the integrated circuit. Coupling the shield region to the other metallization layer acts to reduce parasitic capacitance associated with a circuit node in the other metallization layer, by causing the voltage on the shield region to track the voltage of the circuit node.

The invention can be applied to numerous integrated circuit applications. For example, in a fingerprint sensor cell implementation of the invention, the shield region is in the form of a shield plate underlying a sensor plate in the sensor cell and serves to increase the metal density of a lower-level metallization layer in the cell. The sensor plate is coupled to the shield plate via a unity-gain amplifier, so as to reduce the parasitic capacitance seen by the sensor plate, thereby improving the ability of the sensor cell to detect capacitances indicative of certain fingerprint characteristics.

DETAILED DESCRIPTION OF THE INVENTION

The invention will be illustrated below in conjunction with exemplary integrated circuits including multiple metallization layers. Although particularly well-suited for use in integrated circuit which includes one or more circuit nodes sensitive to parasitic capacitance, such as an integrated circuit including fingerprint sensor cells, the invention is not limited to use with any particular type of circuit. The term "shield region" as used herein is intended to include any type of metallic plate or other type of metallic conductive region that may formed in a metallization layer so as to increase the metal density of that layer.

The present invention solves the problems associated with insufficient metal density in an metallization layer of an integrated circuit in a manner which also decreases the parasitic capacitance associated with circuit nodes of an overlying or underlying metallization layer. The invention in an illustrative embodiment involves forming a metal shield region of metallization in a metallization layer which would otherwise have insufficient metal density to be properly fabricated. The metal shield region in this embodiment underlies a circuit node or other portion of a higher metallization layer that one desires to shield from parasitic capacitance. A unity gain amplifier or other suitable coupling mechanism is used to couple the shielded portion of the higher metallization layer to the underlying shield region. This causes voltages on the shielded portion and the underlying shield region to track one another, such that charges will not build up across the dielectric separating the shielded portion and the shield region. As a result, there is minimal parasitic capacitance between the shield region and the shielded portion of the higher metallization layer. Any parasitic capacitances below the shield region are seen by the shield region but not by the shielded portion of the higher metallization layer. In other embodiments, the shield region may be arranged to provide shielding for a portion of an underlying metallization layer.

Figure 1A:
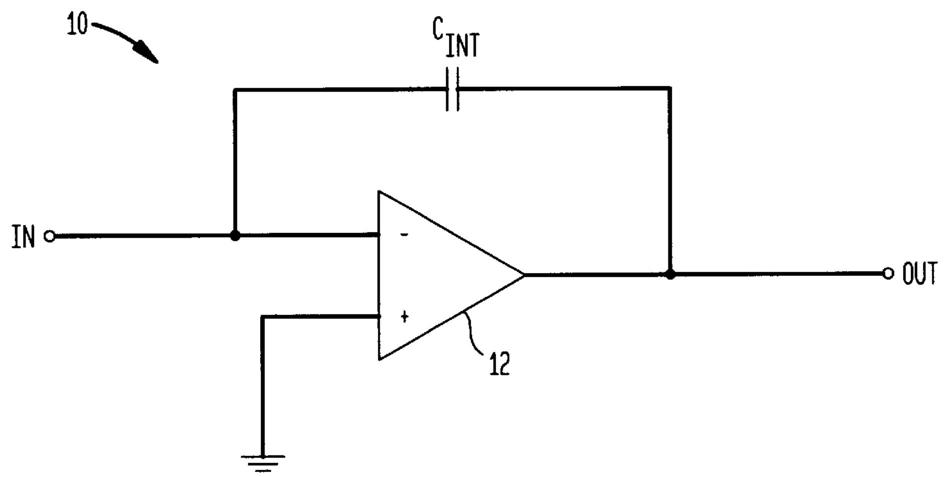
FIGS. 1A, 1B and 1C illustrate an embodiment of the invention as applied to an exemplary integrator.
Figure 1B:
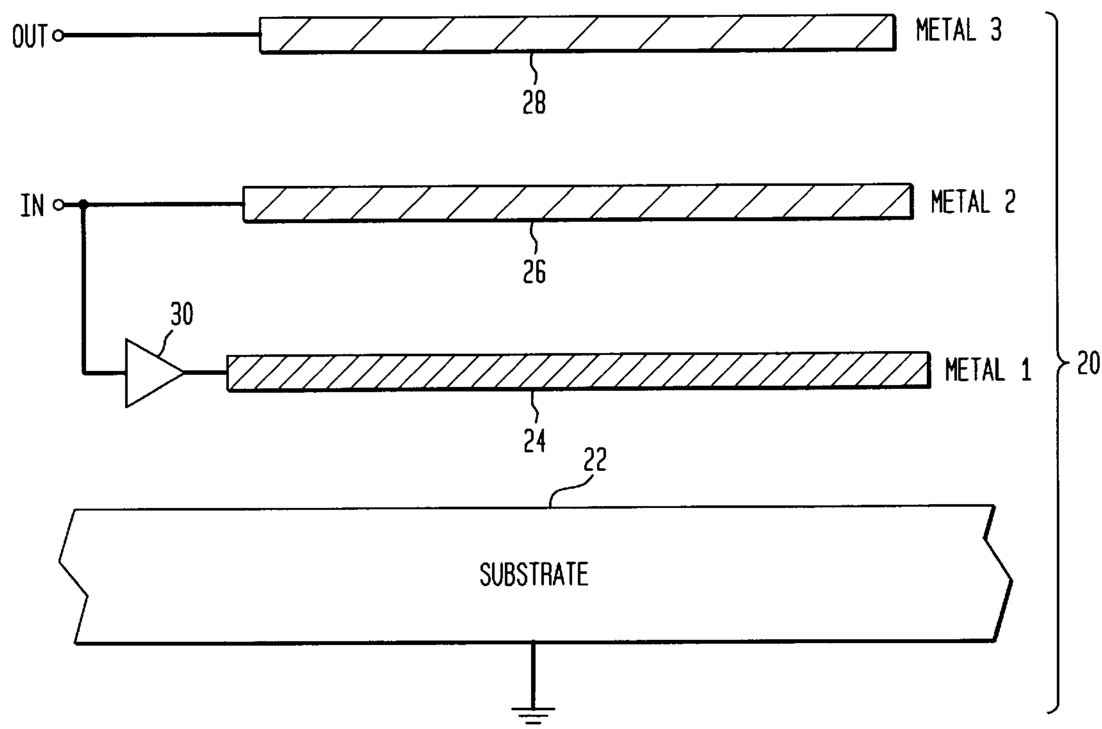
Figure 1C:
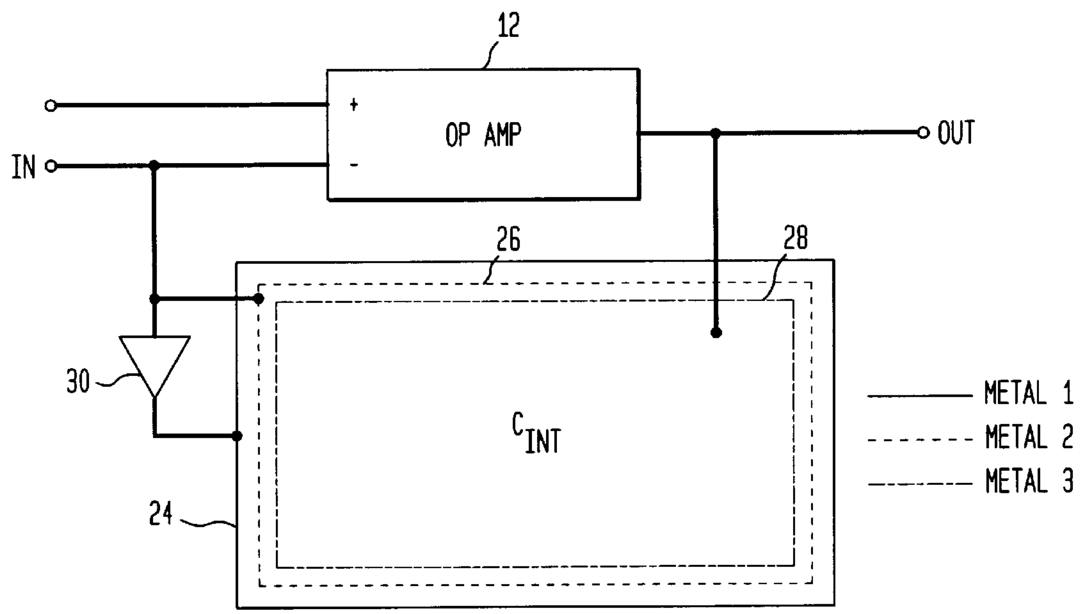

FIGS. 1A, 1B and 1C illustrate, for an exemplary circuit, the manner in which metal density of a metallization layer can be increased while also protecting various circuit nodes from parasitic capacitance. FIG. 1A shows a simple integrator 10 which includes an operational amplifier 12. An integrator capacitor $C_{INT}$ is coupled between an input node IN and an output node OUT of the integrator 10. The input node IN is coupled to an inverting terminal of the amplifier 12, and a non-inverting terminal of amplifier 12 is connected to ground. FIG. 1B shows how various portions of the integrator 10 may be formed in an integrated circuit 20 using the techniques of the invention. The portion of integrated circuit 20 shown in cross-sectional view in FIG. 1B includes a substrate 22 coupled to ground potential, and three different metallization layers designated Metal 1, Metal 2 and Metal 3. The metallization layers Metal 1, Metal 2 and Metal 3 include respective conductive regions 24, 26 and 28. As will be described in detail below, conductive region 24 represents a shield region arranged between the substrate 22 and the conductive region 26 of the overlying Metal 2 layer. The conductive region 26 in the Metal 2 layer corresponds to the circuit node IN. The conductive region 28 in the Metal 3 layer corresponds to the circuit output node OUT. FIG. 1C is a schematic diagram of the FIG. 1A circuit in which the conductive regions 24, 26 and 28 of FIG. 1B are shown in a top-down view.

It should be noted that the arrangement of conductive regions 24, 26 and 28 and other parts of the integrated circuit are simplified in FIGS. 1B and 1C for clarity of illustration. For example, although not shown in FIG. 1B, dielectric layers are typically used to separate the various metallization layers, and the metallization layers can have a wide variety of different thicknesses, shapes, etc. The conventional characteristics of these metallization layers and techniques for forming such layers are well known in the art and will not be described in detail herein. It will also be appreciated by those skilled in the art that the metallization layers Metal 1, Metal 2 and Metal 3 can generally extend over substantially the entire surface of a given integrated circuit, and that only relatively small portions of those layers are illustrated in simplified form in FIGS. 1B and 1C. Furthermore, although not shown in FIG. 1B, the integrated circuit 20 will generally include active semiconductor devices formed in and on the substrate 22, such as transistors and other components of the operational amplifier 12.

In the integrator 10 of FIG. 1A, the input node IN represents a circuit node which is sensitive to parasitic capacitance. Conventional design practice would generally remove all of the Metal 1 layer below region 26 to minimize the parasitic capacitance at the circuit node. However, metal-to-metal capacitors such as the one formed by regions 26 and 28 can be large in area, and if there are a significant number of these in a given integrated circuit, removing all of the Metal 1 layer below each capacitor may lead to the Metal 1 layer having insufficient density. Assume that, without including the shield region 24, the Metal 1 layer of the integrated circuit 10 will have a metal density which is below a minimum desired density for proper fabrication of that layer. Conventional techniques would dictate that a metal patch be formed in the Metal 1 layer and tied to ground potential or to the substrate 22. As previously noted, this would be highly undesirable in that it would tend to significantly increase the parasitic capacitance of any circuit node that is formed in a higher metallization layer and overlies the metal patch.

In accordance with the invention, the capacitance-sensitive circuit node IN formed in conductive region 26 of the Metal 2 layer overlies the shield region 24 of metallization the Metal 1 layer. Moreover, the circuit node IN and its corresponding conductive region 26 are coupled to the shield region 24 in the Metal 1 layer via a unity-gain amplifier 30. This ensures that the voltage on the shield region 24 tracks the voltage on the circuit node IN and its corresponding conductive region 26. As a result, the parasitic capacitance between the IN node and the substrate is actually reduced by the presence of the shield plate 24, rather than increased as would occur if a conventional metal patch were used. The invention thus solves the problem of increasing metal density for a given metallization layer, while simultaneously reducing the parasitic capacitance associated with circuit nodes in higher metallization layers. The unity-gain amplifier 30, although illustrated schematically in FIGS. 1B and 1C, may be implemented using active devices formed in and on substrate 22 in a conventional manner.

Figure 2:
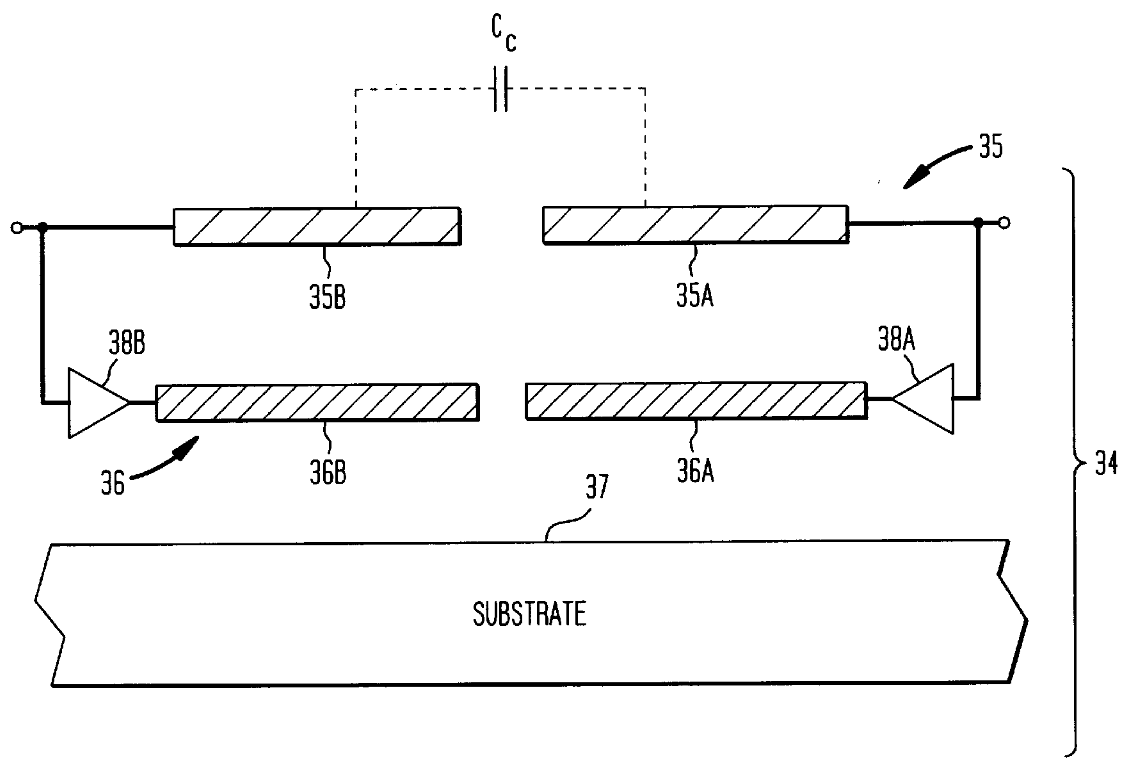
FIGS. 2, 3A and 3B show other embodiments of the invention.

FIG. 2 illustrates another embodiment of the invention. In this embodiment, an integrated circuit 34 includes a conductive region 35 formed in a Metal 2 layer of the circuit 34. The conductive region 35 includes a first portion 35A and a second portion 35B separated as shown. A coupling capacitance $C_C$ is present between the first and second portions of the conductive region 35. The conductive region 35 and its coupling capacitance $C_C$ represent a circuit node of the integrated circuit 34 that is sensitive to capacitance. Again, assume that the Metal 1 layer is determined to have an insufficient metal density to ensure proper fabrication. In accordance with the invention, a shield region 36 is formed in the Metal 1 layer over the substrate 37 so as to increase the metal density of the Metal 1 layer to a value which is above the minimum desired metal density for proper fabrication. This shield region 36 includes a first portion 36A and a second portion 36B. The portions 36A and 36B are arranged in the Metal 1 layer so as to underlie the corresponding portions 35A and 35B of the capacitance-sensitive conductive region 35 of the Metal 2 layer. The portions 36A and 36B are coupled to the corresponding portions 35A and 35B via unity-gain amplifiers 38A and 38B, respectively. As a result, the parasitic capacitance as seen by the conductive region 35 is significantly reduced.

Figure 3A:
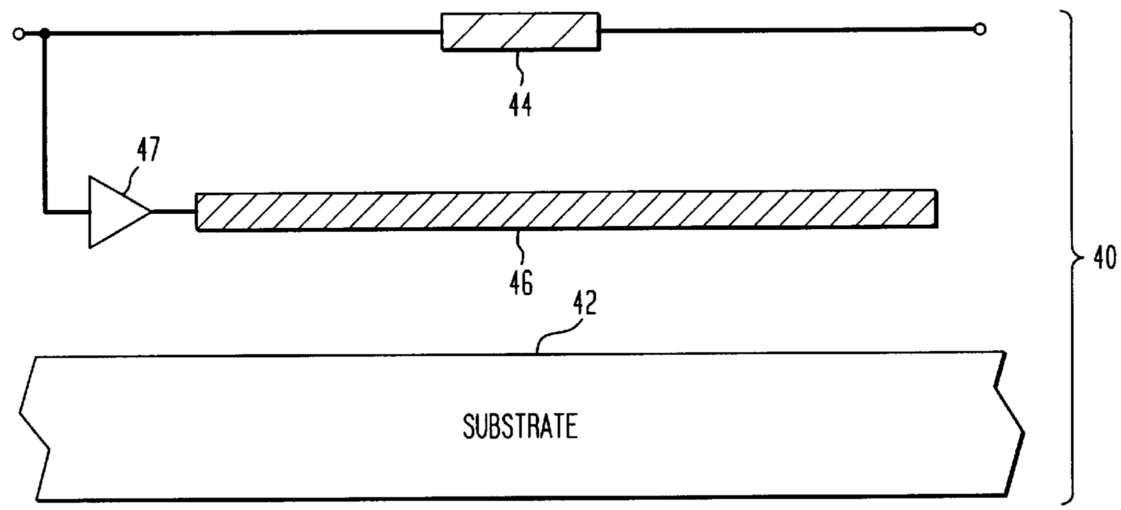
Figure 3B:
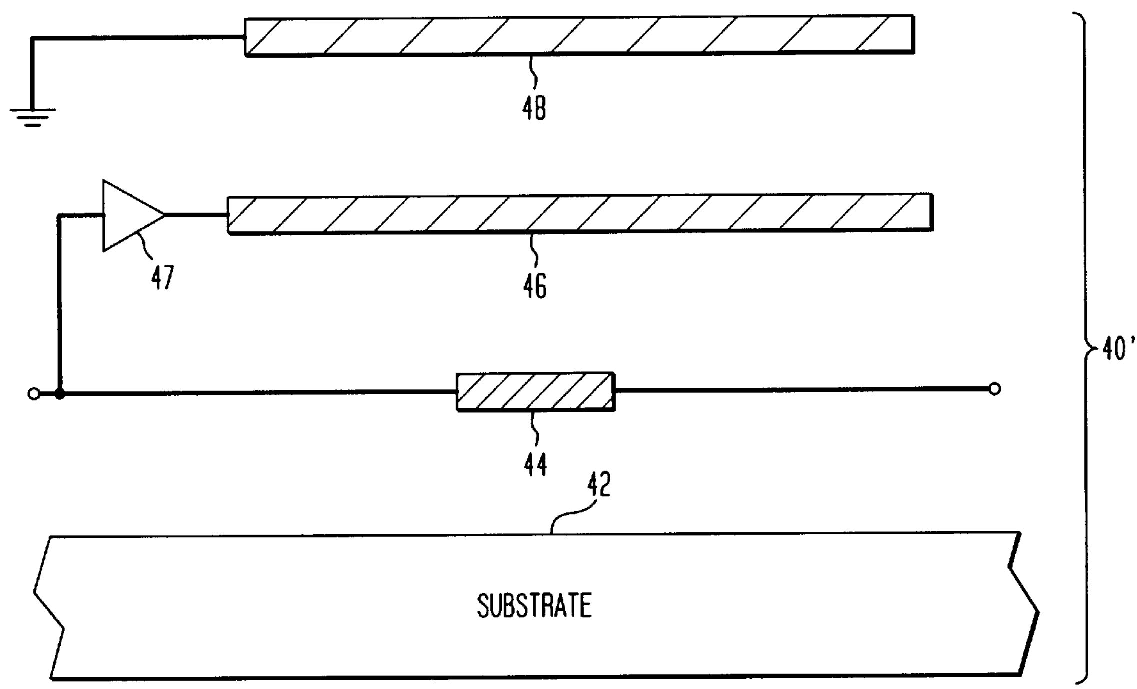

FIGS. 3A and 3B illustrate other implementations of the invention. FIG. 3A shows an integrated circuit 40 which includes a substrate 42, a circuit node 44 formed in a first metallization layer, and a shield region 46 formed in a second metallization layer underlying the first metallization layer. The shield region 46 is coupled to the circuit node 44 via an amplifier 47. The shield region 46 is formed in the second metallization layer so as to increase its metal density to a value which is at or above a minimum desired density level for proper fabrication. Moreover, the shield region 46 is arranged within the second metallization layer to underlie the circuit node 44, and as a result of the coupling between shield region 46 and node 44, the parasitic capacitance seen by node 44 is considerably reduced. The coupling may be via amplifier 47 as shown, or via any other coupling mechanism which will serve to allow the shield region 46 to reduce the parasitic capacitance as seen the circuit node 44. It should be noted that the shield region 46 need not be formed in a Metal 1 layer as in the embodiments of FIGS. 1B, 1C and 2. Instead, the shield region may be formed in any metallization layer of an integrated circuit, and may be coupled to some portion of a higher or lower metallization layer in that circuit. FIG. 3B shows an alternative embodiment of the invention in which the shield region 46 is formed in a metallization layer which overlies the metallization layer including the circuit node 44. The shield region 46 underlies another metallization layer which includes a conductive region 48 connected to ground potential. The shield region 46 in this embodiment is operative to reduce the parasitic capacitance between circuit node 44 and the conductive region 48.

Figure 4A:
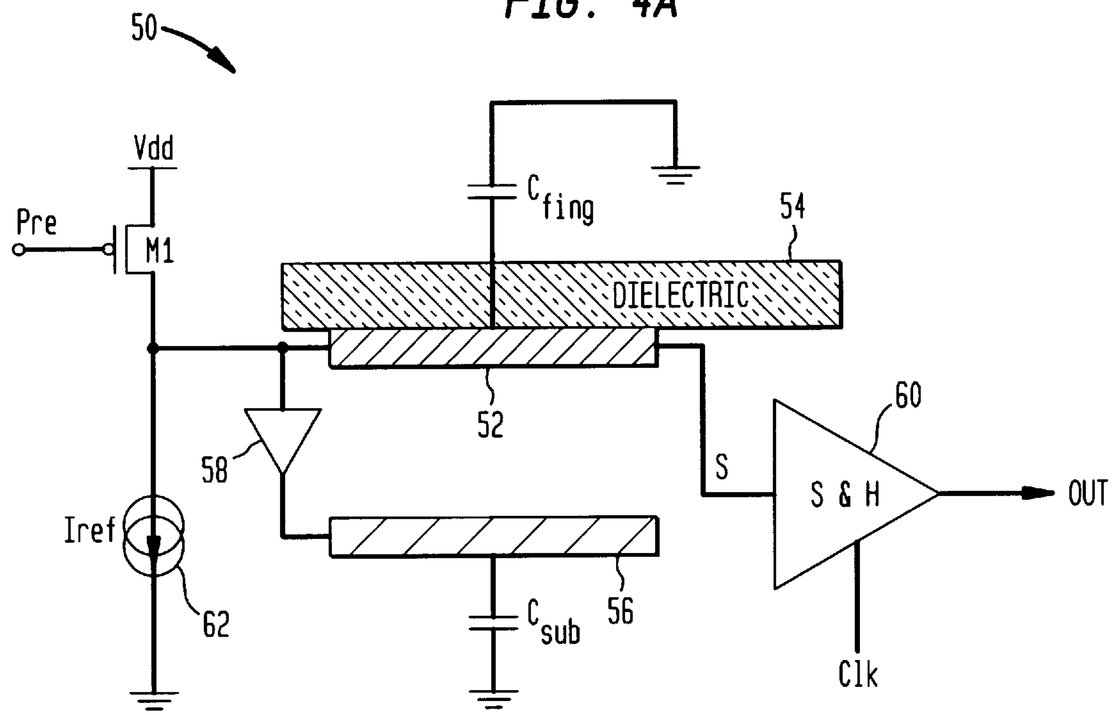
FIGS. 4A and 4B illustrate the manner in which the invention may be implemented in a sensor cell in an integrated circuit.
Figure 4B:
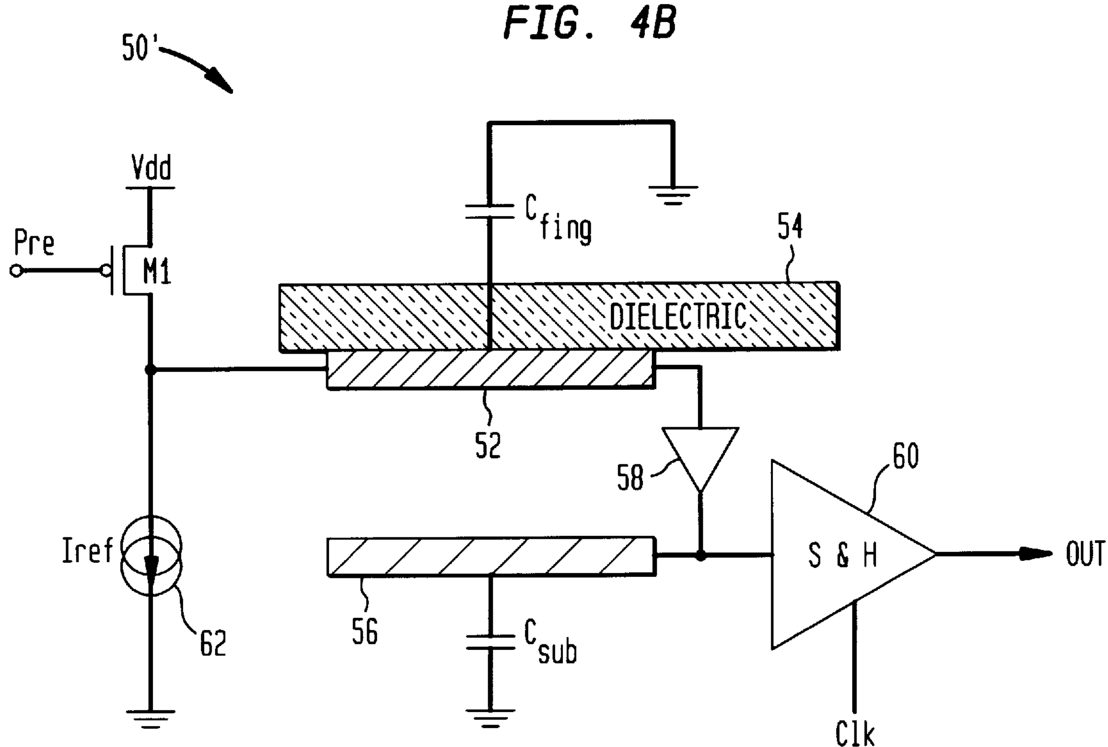

FIGS. 4A and 4B illustrate the implementation of the invention in a sensor cell of an integrated circuit. As noted above, the invention is particularly well suited for use in applications which include circuit nodes sensitive to parasitic capacitance. One such application is in sensor cells used for solid-state fingerprint sensors. Conventional solid-state fingerprint sensors distinguish fingerprint characteristics by sensing capacitance variations between ridges and valleys in a fingerprint brought into contact with an array of the sensors. Such sensors are described in, for example, U.S. Pat. No. 5,325,442 issued to Knapp; M. Tartagni and R. Guerrieri, "A 390 dpi Live Fingerprint Imager Based on Feedback Capacitive Sensing Scheme," IEEE Solid State Circuits Conference, Vol. 40, February 1997; and N. D. Young et al., "Novel Fingerprint Scanning Arrays Using Polysilicon TFTs on Glass and Polymer Substrates," IEEE Electron Device Letters, Vol. 18, No. 1, pp. 19–20, January 1997; all of which are incorporated by reference herein.

The sensor cells in conventional fingerprint sensors generally include a sensor plate which is formed in a particular metallization layer of the sensor integrated circuit. Due to the relatively small capacitance variations which must be measured using the sensor plate, the sensor plate represents a circuit node which is sensitive to parasitic capacitances. Moreover, many such sensor plates are formed in a metallization layer which overlies a substantially less dense metallization layer in the integrated circuit. Although it may be desirable to increase the metal density of the less dense metallization layer, it has not heretofore been practical to do so. This is because the use of the above-described conventional techniques would unduly increase the parasitic capacitance seen by the sensor plate, thereby limiting the ability of the sensor to measure capacitance variations. The present invention solves this problem by increasing the metal density of a metallization layer underlying the sensor plate layer, while at the same time reducing the parasitic capacitance seen by the sensor plate.

FIG. 4A shows one embodiment of a sensor cell 50 of an integrated circuit configured in accordance with the invention. In the sensor cell 50, the capacitance $C_{fing}$ represents the capacitance between a sensor plate 52 and a portion of a fingerprint brought into contact with a contact surface of the circuit and separated from the sensor plate 52 by a dielectric 54. The sensor plate 52 is formed in, for example, a Metal 2 or Metal 3 layer of the sensor integrated circuit. The dielectric 54 includes the surface passivation material of the sensor integrated circuit. A shield plate 56 is formed in a lower metallization layer than the sensor plate 52, for example, a Metal 1 layer. The sensor plate 52 is coupled to the shield plate 56 via a unity-gain amplifier 58. This causes the voltage on the shield plate 56 to actively track the voltage on the sensor plate 52.

In operation, the sensor plate 52 of sensor cell 50 is first precharged to the positive power supply voltage Vdd by applying an appropriate logic signal "Pre" to the gate of the field-effect device M1. The precharged voltage on the sensor plate is then measured by applying an appropriate clock signal "Clk" to a sample-and-hold circuit 60. The sensor plate 52 is then discharged by a constant current reference Iref generated by a current source 62. The rate at which the sensor plate discharges is variable depending on the total sensor plate capacitance. This capacitance is a function of whether a fingerprint ridge or valley is present above the sensor plate 52, as well as the parasitic capacitance $C_{sub}$ seen by the sensor plate 52. The discharge rate is therefore slower for the larger capacitance associated with a ridge, and faster for the smaller capacitance associated with a valley. The discharged sensor plate voltage is sampled after a fixed interval, and the sampled voltage is subtracted from the previously sampled precharge voltage. This difference between the voltages gives a measure of the discharge rate and hence an indication as to whether a fingerprint ridge or valley is present over the sensor plate. An array comprising a large number of the sensor cells 50 can thus be used to characterize an entire fingerprint.

In the sensor cell 50, the active coupling between sensor plate 52 and shield plate 56 prevents the storage of charge between these plates. The shield plate 56 essentially shields the sensor plate 52 from the underlying substrate, thereby substantially reducing the parasitic capacitance $C_{sub}$ which would otherwise appear between the sensor plate 52 and the substrate in the absence of the shield plate 56. The dominant capacitance seen by the sensor plate 52 is now $C_{fing}$, which considerably increases the dynamic range of the sensor cell 50. FIG. 4B shows an alternative sensor cell 50' in which the unity-gain amplifier 58 is coupled between the sensor plate 52 and an input of the sample-and-hold circuit 60, and the shield plate 56 is coupled to the input of the sample-and-hold circuit 60. This alternative embodiment is configured to provide a buffered sensor plate output to the input of the sample-and-hold circuit 60, thereby reducing the effects of noise, e.g., in applications in which sample-and-hold circuit 60 is located a substantial distance away from the sensor plate 52.

The above-described embodiments of the invention are intended to be illustrative only. For example, alternative embodiments may utilize different types and arrangements of metallization layers and circuit nodes, different types of amplifiers or other coupling mechanisms to couple a sensor plate or other circuit node to an underlying shield region, and any desired integrated circuit configuration. These and numerous other alternative embodiments within the scope of the following claims will be apparent to those skilled in the art.

What is claimed is:

1. A method of providing an increased metal density in a first metallization layer of an integrated circuit, the method comprising the steps of:

forming a shield region of metallization in the first metallization layer so as to increase the metal density of the first metallization layer; and coupling the shield to at least a portion of another metallization layer in the integrated circuit, such that the shield region acts to reduce parasitic capacitance associated with a circuit node in the other metallization layer.

2. The method of claim 1 wherein the other metallization layer overlies the first metallization layer in the integrated circuit.

3. The method of claim 1 wherein the other metallization layer underlies the first metallization layer in the integrated circuit.

4. The method of claim 1 wherein the shield region in the first metallization layer increases the metal density of the first metallization layer from a first value below a desired minimum density for proper fabrication to a second value at or above the minimum density.

5. The method of claim 1 wherein the forming step includes forming the shield region in the form of a shield plate underlying the circuit node in the other metallization layer.

6. The method of claim 1 wherein the coupling step includes coupling the shield region of metallization to the other metallization layer via an amplifier having an input coupled to the circuit node in the other metallization layer and an output coupled to the shield region.

7. The method of claim 1 wherein the coupling step includes coupling the region of metallization to the other metallization layer via a unity-gain amplifier.

8. The method of claim 1 wherein the integrated circuit includes a sensor cell having a sensor plate formed in the other layer of metallization, and the forming step includes the step of forming the shield region as a shield plate arranged so as to underlie the sensor plate.

9. The method of claim 8 wherein the coupling step includes coupling the sensor plate and the shield plate via an amplifier having an input coupled to the sensor plate and an output coupled to the shield plate.

10. The method of claim 8 wherein the sensor cell includes a sampling circuit, and the method further includes the step of coupling the sensor plate to an input of the sampling circuit, such that the sampling circuit samples an output of the sensor cell from the sensor plate.

11. The method of claim 8 wherein the sensor cell includes a sampling circuit, and the method further includes the step of coupling the shield plate to an input of the sampling circuit, such that the sampling circuit samples an output of the sensor cell from the shield plate.

12. An integrated circuit comprising:

a first metallization layer having a shield region formed therein for providing an increased metal density in the first metallization layer; and another metallization layer in the integrated circuit, wherein the shield region is coupled to at least a portion of the other metallization layer such that the shield region acts to reduce parasitic capacitance associated with a circuit node in the other metallization layer.

13. The integrated circuit of claim 12 wherein the other metallization layer overlies the first metallization layer in the integrated circuit.

14. The integrated circuit of claim 12 wherein the other metallization layer underlies the first metallization layer in the integrated circuit.

15. The integrated circuit of claim 12 wherein the shield region in the first metallization layer increases the metal density of the first metallization layer from a first value below a desired minimum density for proper fabrication to a second value at or above the minimum density.

16. The integrated circuit of claim 12 wherein the shield region is in the form of a metal shield plate underlying the circuit node in the other metallization layer.

17. The integrated circuit of claim 12 wherein the shield region of metallization is coupled to the other metallization layer via an amplifier having an input coupled to the circuit node in the other metallization layer and an output coupled to the shield region.

18. The integrated circuit of claim 12 wherein the shield region of metallization is coupled to the other metallization layer via a unity-gain amplifier.

19. The integrated circuit of claim 12 further including a sensor cell having a sensor plate formed in the other layer of metallization, and wherein the shield region is formed as a shield plate arranged so as to underlie the sensor plate.

20. The integrated circuit of claim 19 wherein the sensor plate is coupled to the shield plate via an amplifier having an input coupled to the sensor plate and an output coupled to the shield plate.

21. The integrated circuit of claim 19 wherein the sensor cell includes a sampling circuit, and the sensor plate is coupled to an input of the sampling circuit, such that the sampling circuit samples an output of the sensor cell from the sensor plate.

22. The integrated circuit of claim 19 wherein the sensor cell includes a sampling circuit, and the shield plate is coupled to an input of the sampling circuit, such that the sampling circuit samples an output of the sensor cell from the shield plate.

23. An apparatus for providing an increased metal density in a first metallization layer of an integrated circuit, the apparatus comprising:

means for providing a shield region of metallization in the first metallization layer so as to increase the metal density of the first metallization layer; and means for coupling the shield region of metallization to at least a portion of another metallization layer in the integrated circuit, such that the shield region acts to reduce parasitic capacitance associated with a circuit node in the other metallization layer.

24. The apparatus of claim 23 wherein the shield region of metallization in the first metallization layer increases the metal density of the first metallization layer from a first value below a desired minimum density for proper fabrication to a second value at or above the minimum density.

* * * * *